(12) United States Patent
Rhee et al.

(10) Patent No.: US 7,999,584 B2
(45) Date of Patent: *Aug. 16, 2011

(54) METHOD AND APPARATUS FOR ON-CHIP PHASE ERROR MEASUREMENT TO DETERMINE JITTER IN PHASE-LOCKED LOOPS

(75) Inventors: Woogeun Rhee, Beijing (CN); Daniel J. Friedman, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/543,672

(22) Filed: Aug. 19, 2009

(65) Prior Publication Data

US 2009/0302906 A1   Dec. 10, 2009

Related U.S. Application Data

(62) Division of application No. 11/622,166, filed on Jan. 11, 2007.

(51) Int. Cl.
*H03L 7/06* (2006.01)
(52) U.S. Cl. .......................... 327/156; 327/147
(58) Field of Classification Search .................. 327/147, 327/156
See application file for complete search history.

(56) References Cited

U.S. PATENT DOCUMENTS

| | | | |
|---|---|---|---|
| 6,693,978 B1 * | 2/2004 | Horii et al. | 375/326 |
| 7,511,543 B2 * | 3/2009 | Friedman et al. | 327/156 |
| 7,692,501 B2 * | 4/2010 | Hsueh et al. | 331/25 |
| 7,746,180 B2 * | 6/2010 | Yamane et al. | 331/25 |
| 7,764,094 B1 * | 7/2010 | Arora | 327/157 |
| 7,816,960 B2 * | 10/2010 | Saint-Laurent et al. | 327/158 |
| 2004/0146101 A1 | 7/2004 | Pearce | |
| 2004/0160874 A1 | 8/2004 | Hwang et al. | |
| 2005/0151593 A1 | 7/2005 | Chen | |
| 2006/0267695 A1 | 11/2006 | Keating | |
| 2008/0048742 A1 * | 2/2008 | Kawai | 327/158 |
| 2008/0172193 A1 * | 7/2008 | Rhee et al. | 702/69 |
| 2008/0191746 A1 * | 8/2008 | Friedman et al. | 327/5 |
| 2009/0243679 A1 * | 10/2009 | Smith et al. | 327/158 |
| 2009/0289672 A1 * | 11/2009 | Hua et al. | 327/147 |

(Continued)

FOREIGN PATENT DOCUMENTS

KR    20040027350 A    4/2004

OTHER PUBLICATIONS

Shiro Dosho at al., "A Background Optimization Method for PLL by Measuring Phase Jitter Performance", IEEE Journal of Solid-State Circuits, vol. 40, No. 4, Apr. 2005; pp. 941-950.

Phillip J. Reste, et al., "Timing Uncertainty Measurements on the Power5 Microprocessor" ISSCC 2004/Session 19/ Clock Generation and Distribution/19.7; IEEE International Solid-State Circuits Conference; 2004; 8 pages.

*Primary Examiner* — Lincoln Donovan
*Assistant Examiner* — Adam D Houston
(74) *Attorney, Agent, or Firm* — Tutunjian & Bitetto, P.C.; Anne V. Dougherty, Esq.

(57) ABSTRACT

An apparatus includes a phase-locked loop (PLL) circuit including a phase-frequency detector configured to output phase error signals. A phase error monitor circuit is configured to determine instantaneous peak phase error by logically combining the phase error signals and comparing pulse widths of the logically combined phase error signals to a programmable delay time at each reference clock cycle to determine instantaneous phase error change. A storage element is configured to store the instantaneous phase error change.

14 Claims, 10 Drawing Sheets

U.S. PATENT DOCUMENTS

2009/0302905 A1* 12/2009 Rhee et al. .................. 327/156
2009/0302906 A1* 12/2009 Rhee et al. .................. 327/156
2010/0134159 A1* 6/2010 Jin ............................... 327/156
2010/0171527 A1* 7/2010 Maeda ........................... 327/7

* cited by examiner

METHOD AND APPARATUS FOR ON-CHIP PHASE ERROR MEASUREMENT TO DETERMINE JITTER IN PHASE-LOCKED LOOPS

RELATED APPLICATION INFORMATION

This application is a Divisional application of co-pending U.S. patent application Ser. No. 11/622,166 filed on Jan. 11, 2007, incorporated herein by reference in its entirety. This case is related to application Ser. No. 12/543,655, filed concurrently herewith.

BACKGROUND

1. Technical Field

The present invention relates to on-chip diagnostics and testability, and in particular, to phase-locked loop circuits with jitter measurement.

2. Description of the Related Art

As technology advances, predicting the behavior of transistor devices and passive elements such as resistors and capacitors becomes increasingly difficult. Increased uncertainty in the modeling of these devices sometimes mandates integrated circuit designs to function beyond original targets in order to provide enough performance margin over process, voltage, and temperature (PVT) variations. Conservative designs may often result in more power and area consumption than is needed.

If internal system parameters can be measured and used to adjust the system parameters, the system design margin can be greatly enhanced. In the past, system diagnostics were performed by measuring available off-chip test nodes. However, an external diagnostic path is slow, and solutions are not always found. Furthermore, the limited off-chip visibility of internal analog/digital waveforms results in limited learning rates for yield. Hence, the demand for on-chip testability and diagnostics has greatly increased.

In phase-locked loop (PLL) design, key PLL parameters such as jitter, static phase error, and control voltage range are extremely difficult to evaluate in integrated systems. Among these, measuring jitter performance is very challenging, as timing uncertainty in clock generation increases with modern technology.

SUMMARY

Jitter measurement methods may detect timing metastability in a large set of latches. By deploying the large set of latches and delay lines, timing uncertainty in a zero-time crossing of some latches could be detected. However, a large number of delay lines could induce additional jitter generation, possibly degrading jitter measurement performance. For example, an instantaneous fluctuation of the supply voltage caused by on-chip digital switching circuits can prevent the short-term jitter measurement from being reliably performed. Also, jitter measurements using an analog charge pump are not favorable due to mismatch requirements of transistors.

On the other hand, a long-term jitter measurement is more immune to instantaneous on-chip variations and provides a more reliable way of evaluating system performance. In accordance with present embodiments, an illustrative method focuses on phase-locked loop (PLL) circuits, thus simplifying hardware complexity by using information already present in the PLL. A monitor circuit operates by measuring a phase error at each reference clock cycle with a programmable error-detection threshold and saves the information in latches for post processing.

An illustrative circuit in accordance with the present principles employs an all-digital instantaneous phase error detector (IPED) and detects peak phase error amplitude only instead of measuring metastability in the zero-time crossing. This makes it possible to make use of relatively simple lumped delay lines. Further, the hardware complexity does not depend on a voltage controlled oscillator (VCO) frequency since the hardware detects phase error amplitude at the phase-frequency detector (PFD) output.

An apparatus includes a phase-locked loop (PLL) circuit including a phase-frequency detector configured to output phase error signals. A phase error monitor circuit is configured to determine instantaneous peak phase error by logically combining the phase error signals and comparing pulse widths of the logically combined phase error signals to a programmable delay time at each reference clock cycle to determine instantaneous phase error change. A storage element is configured to store the instantaneous phase error change.

Another apparatus includes a phase-locked loop (PLL) circuit including a phase-frequency detector configured to output phase error signals. A phase error monitor circuit is configured to determine instantaneous peak phase error. The phase error monitor circuit includes an exclusive OR gate configured to logically combine the phase error signals to provide a first output signal, and a programmable delay line configured to provide a delay time to the first output signal as a threshold against which instantaneous phase error change of the output signal is measured at each reference clock cycle. A storage element is configured to store the instantaneous phase error change.

Yet another apparatus includes a phase-locked loop (PLL) circuit including a phase-frequency detector configured to output phase error signals, and a phase error monitor circuit configured to determine peak instantaneous phase error by logically combining the phase error signals and comparing pulse widths of the logically combined phase error signals to a programmable delay time at each reference clock cycle to determine instantaneous phase error change. The instantaneous phase error change includes a difference signal and a raw signal. A multiplexer is configured to receive as inputs and select one of the difference signal and the raw signal. An accumulator is coupled to an output of the multiplexer to accumulate instantaneous phase error change counts associated with a time window.

Yet another apparatus includes a phase-locked loop (PLL) circuit including a phase-frequency detector configured to output phase error signals, and a phase error monitor circuit configured to determine peak instantaneous phase error by logically combining the phase error signals and comparing pulse widths of the logically combined phase error signals to a programmable delay time at each reference clock cycle to determine instantaneous phase error change. The instantaneous phase error change includes a first signal and a differential signal. A multiplexer is configured to receive as inputs and select one of the first signal and the differential signal. A plurality of counters is coupled to an output of the multiplexer to accumulate instantaneous phase error change counts associated a plurality of instantaneous phase error thresholds such that phase error amplitudes and times are provided to create a jitter histogram.

An apparatus for short-term jitter measurement includes a plurality of programmable delay stages configured to permit selection of a different amount of delay for a clock signal to provide a delayed clock signal for adjustable short-term measurement of jitter movement. A phase detector includes as inputs the clock signal and the delayed clock signal. The phase detector includes a phase-frequency detector configured to output phase error signals. A phase error monitor circuit is configured to determine peak instantaneous phase error change by logically combining the phase error signals and comparing pulse widths of the logically combined phase error signals to a programmable delay time at each reference clock cycle to determine the instantaneous phase error change.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
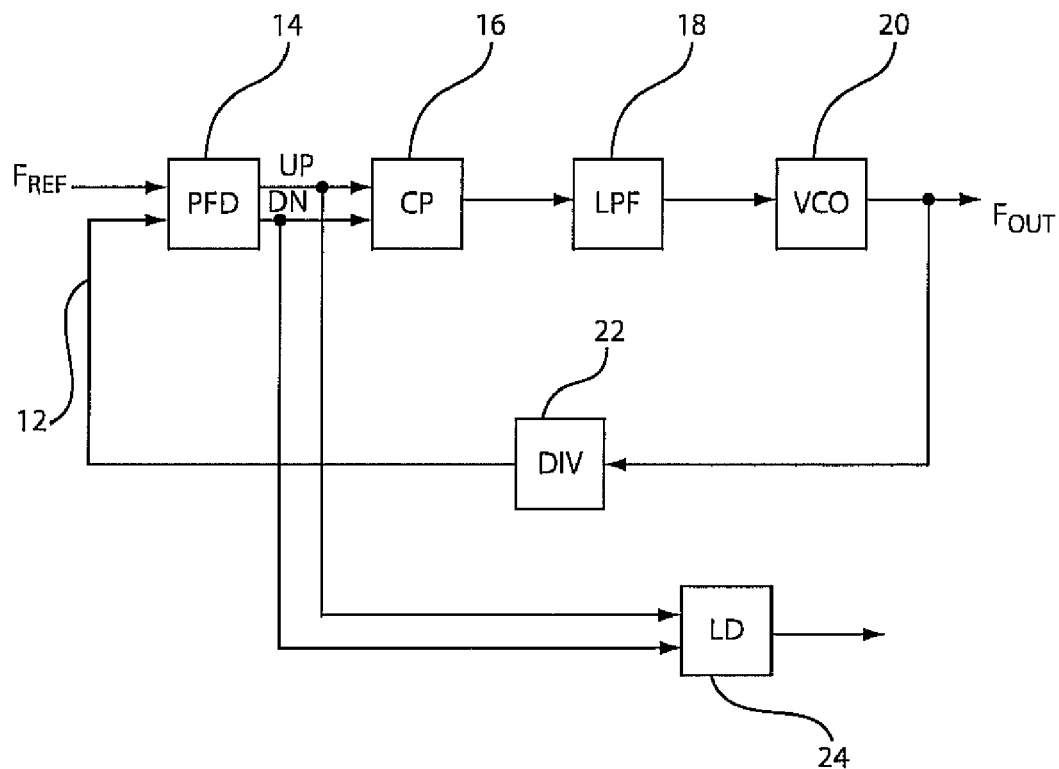
FIG. 1 is a block diagram showing a conventional phase-locked loop (PLL)

A system, apparatus and method employ phase-locked loop (PLL) circuits to simplify hardware complexity by using information already present in the PLL. A monitor circuit in accordance with present principles operates by measuring a phase error at each reference clock cycle with a programmable error-detection threshold and saves the information in latches for post processing. An all-digital peak detector may be employed, which detects peak phase error amplitude only, instead of measuring metastability in the zero-time crossing. Simple lumped delay lines are preferably employed. Hardware complexity and power consumption is reduced since phase error amplitude is detected at a phase-frequency detector (PFD) output, meaning that the monitor circuit does not need to operate at the (typically higher) VCO frequency.

Embodiments of the present invention can take the form of an entirely hardware embodiment, an entirely software embodiment or an embodiment including both hardware and software elements. In embodiments implemented in software, the software may include firmware, resident software, microcode, etc. Preferred embodiments are implemented as circuits in hardware, e.g., as part of an integrated circuit.

The circuits as described herein may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The methods as described herein may be used in the fabrication of integrated circuit chips or in the testing and monitoring of on-chip processes.

In the drawings included in this application, like numerals represent the same or similar elements. Referring initially to FIG. 1, a block diagram of a conventional phase-locked loop (PLL) system 10, which comprises a phase-frequency detector (PFD) 14, a charge pump (CP) 16, a loop filter (LPF) 18, a voltage-controlled oscillator (VCO) 20, a frequency divider (DIV) 22, and a lock detector (LD) 24 is shown. The PFD 14 compares the phase of an incoming reference clock $F_{REF}$ with that of a feedback clock 12, the latter provided at the output of the frequency divider (DIV) 22. The PFD 14 generates logic outputs at varying pulse widths that are provided to the charge pump 16. The charge pump 16 generates an error voltage to tune the VCO frequency. The loop filter 18 between the PFD 14 and the VCO 20 rejects high frequency noise, and, along with other loop components, determines characteristics of the overall PLL behavior. The frequency divider 22 is generally used to enable the VCO frequency $F_{OUT}$ to be higher than that of the reference clock frequency $F_{REF}$. The lock detector 24 is often used in the PLL 10 to provide an indication of the PLL lock status.

Figure 2:
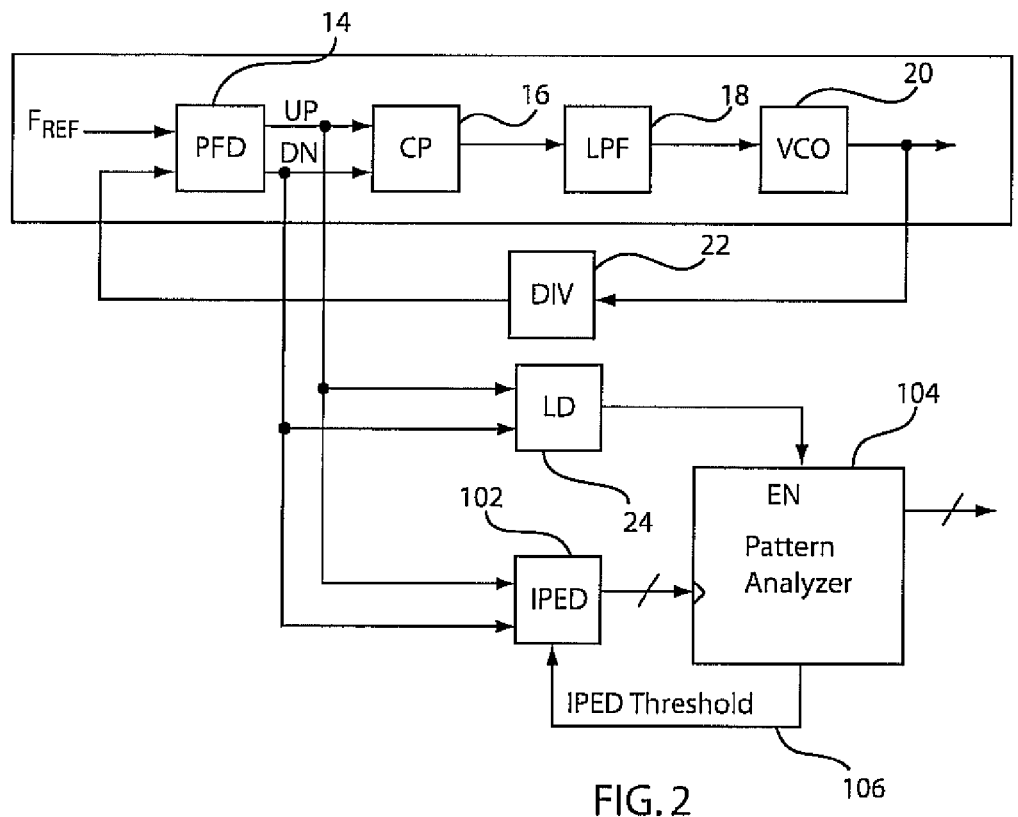
FIG. 2 is a block diagram showing an instantaneous phase error detector (IPED) connected to a PLL in accordance with one illustrative embodiment.
Figure 3:
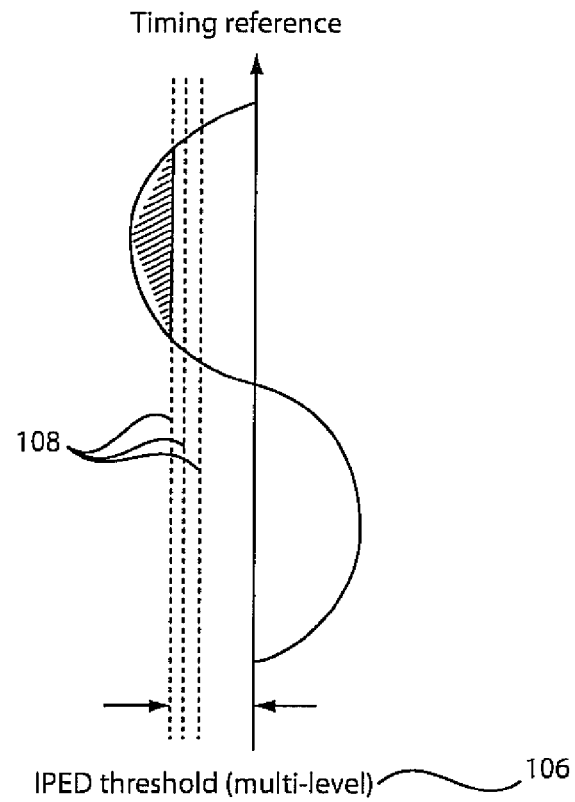
FIG. 3 is a diagram showing a timing reference signal with multiple IPED thresholds indicated which may be provided by a pattern analyzer in accordance with one embodiment.

Referring to FIG. 2, a block diagram of a PLL 100 with an instantaneous phase error detector (IPED) 102 and a pattern analyzer system 104 are illustratively shown in accordance with present principles. By employing digitally programmable peak instantaneous phase error detection boundaries or thresholds 106, the all-digital IPED 102 enables multi-threshold peak phase error movement detection; when combined with post-processing in a pattern analyzer block which could reside on-chip or off-chip, sequences of phase error measurements can be converted to jitter estimates. Multiple thresholds (dotted lines 108 in FIG. 3) may be provided by employing a programmable delay line or lines.

The IPED 102 acts as an instantaneous phase error detector at each reference clock cycle. The accumulation of the instantaneous phase error information can be converted to jitter. The IPED boundary describes a transition between a delay step where the IPED output is low and where it is high. An IPED threshold is the delay beyond which the instantaneous static phase error would yield an output 1. The difference between IPED delay boundary and IPED delay threshold is that the IPED threshold is input referred (e.g., it is the actual trip point in pulse width where IPED output goes high), and the IPED boundary is output referred.

Since the IPED 102 takes PFD logic outputs, UP and DN, which include phase error information based on pulse width modulation, the IPED 102 can be considered an extensive time-to-digital converter. The pattern analyzer 104 collects the digital outputs captured by the IPED 102 and its post-processing provides useful data analysis such as a jitter histogram, lock detection, static phase offset and so on, which will be illustrated later.

Figure 4:
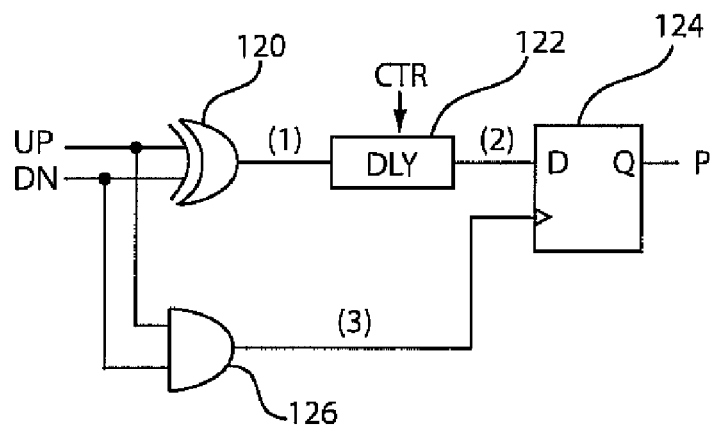
FIG. 4 is a schematic diagram showing an instantaneous phase error detector (IPED) in accordance with one illustrative embodiment.
Figure 5:
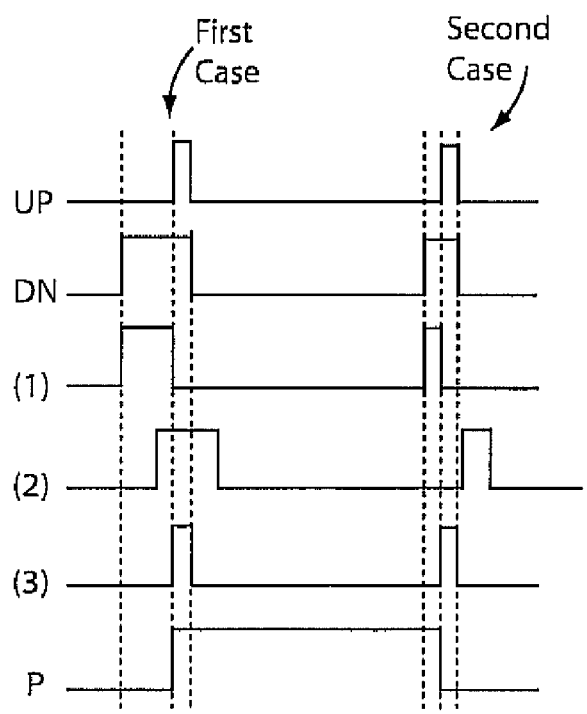
FIG. 5 is a timing diagram illustratively showing pulse width comparisons for transitioning an output of the IPED in accordance with one illustrative embodiment.

Referring to FIGS. 4 and 5, the operation of the IPED 102 is illustratively depicted. For simplicity, the IPED 102 includes a single-level detection as depicted in FIG. 4. IPED 102 includes an XOR gate 120, an AND gate 126, a delay line 122, and a D-type flip-flop (DFF) latch 124. The XOR gate 120 generates a pulse (1) that has net phase-error information; the width of the pulse is the magnitude of the arrival time difference between the reference clock $F_{REF}$ and the feedback clock 12. This arrival time difference will be reflected in the magnitude of the difference in width of the UP and DN signals as labeled in FIG. 1 and FIG. 4, with the XOR gate 120 output pulse (1) capturing that difference magnitude.

Referring again to FIG. 4, the pulse (1) is delayed by the delay line 122, which is controlled by a control signal, CTR, and the delayed pulse (2) is fed into the DFF latch 124 as data input. The clock input (3) of the DFF latch 124 is generated by the AND gate 126.

Depending on the pulse width of (1) which represents the net phase error, the output P of the DFF 124 can be high or low as illustrated in FIG. 5. For example, if the pulse width of (1) is larger than a delay amount set by the delay line 122 (see (2)), then the DFF 124 is set high (first case in the timing diagram). If the pulse width of (1) is smaller than the delay amount set by the delay line 122, then the DFF 124 is set low (second case in the timing diagram). That is, the delay amount provided by delay line 122 sets a threshold of the phase error detection. Hence, the phase movement which varies over time can be detected if a phase detection threshold is close to an IPED boundary of the phase movement. The movement of the IPED boundary over multiple samples is a measurement or estimation of the jitter of the PLL (See FIG. 7). If the delay amount is set by the programmable delay line 122 or by multiple delay lines, the phase movement or phase jitter can be detected more reliably with post processing (e.g., pattern analyzer 104).

Figure 6:
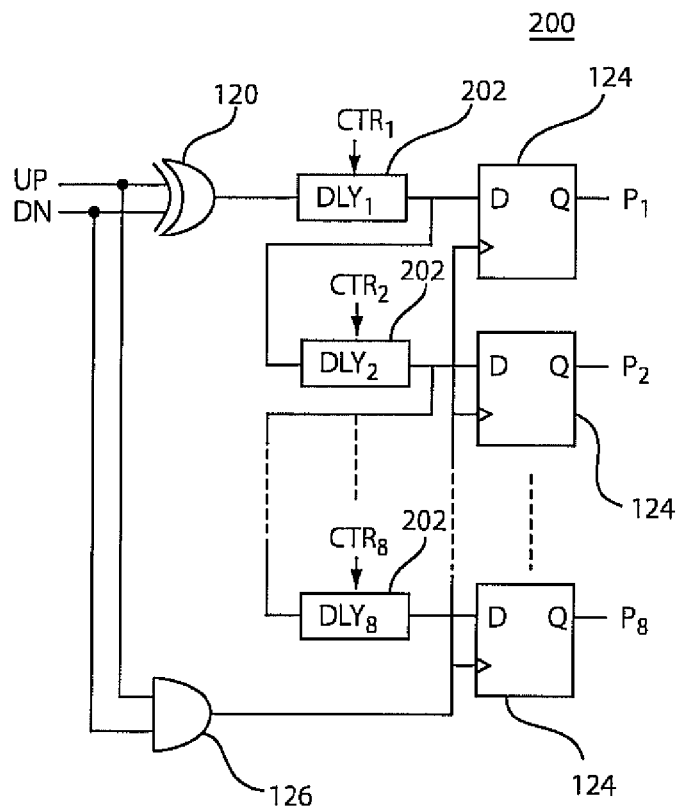
FIG. 6 is a schematic diagram showing an IPED with multi-level thresholds (k=8) in accordance with another illustrative embodiment.
Figure 7:
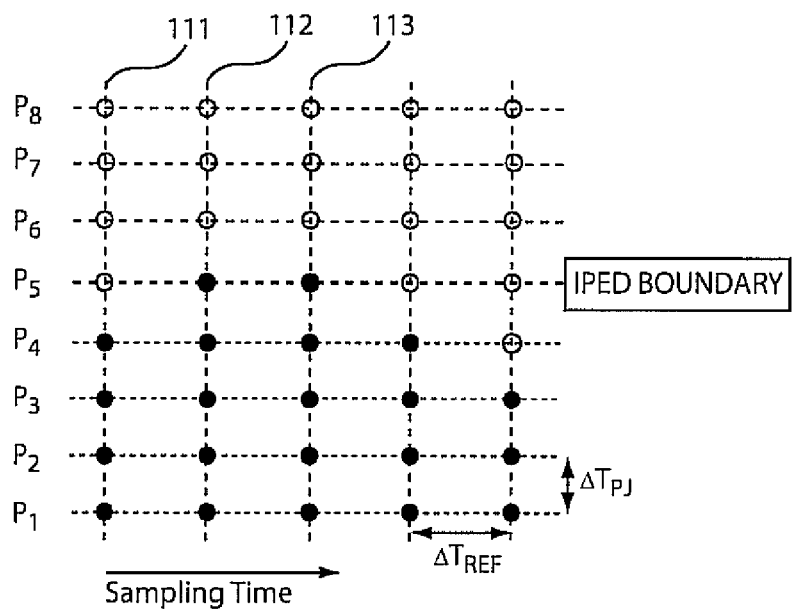
FIG. 7 is a diagram showing output values over time for a plurality of latches in FIG. 6.

Referring to FIGS. 6 and 7, an example of an IPED implementation 200 with 8-level detection thresholds is illustratively shown. In this case, 8 delay lines 202 are cascaded to set different detection levels to generate 8 data outputs ($P_1$ to $P_8$) for each sampling time. It should be understood that any number of levels may be employed. In FIG. 7, an example of data (circles) stored in registers for five reference clock periods ($T_{REF}$) is given. The darkened circles represent the IPED output ($P_{1-8}$) of high, and the clear circles represent the IPED output ($P_{1-8}$) of low. As seen in FIG. 7, the variation of the number of the darkened circles in each column represents the phase movement over five reference clock periods ($\Delta T_{REF}$). The patterns provided may be analyzed by pattern analyzer 104 to discover trends, compute jitter, and potentially to take appropriate action, if desired. Hence, the overall operation of the IPED 200 is similar to the time-to-digital converter (TDC) or a digital lock detector with variable detection threshold. Note that the IPED boundary would occur between $P_4$ and $P_5$ for time step 111, $P_5$ and $P_6$ for time step 112, etc.

Figure 8:
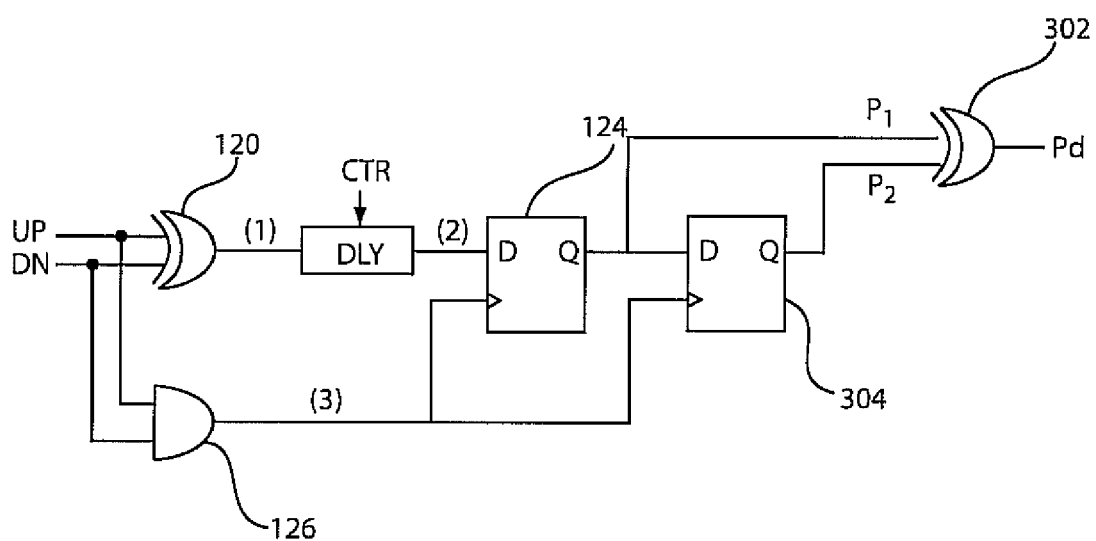
FIG. 8 is a schematic diagram showing a differentiated an instantaneous phase error detector (IPED) in accordance with another embodiment.

Referring to FIG. 8, another embodiment 300 of the IPED is shown which detects only a transition of the IPED data variation. By adding an XOR gate 302 at the outputs of two sequential latches 124 and 304, differential jitter information can be obtained. In this way, the frequency of alternating phase variation can be also detected with post processing.

A detailed post-processing method will be described below and may include using counters or accumulators to measure and record jitter movement. Storing all the data generated by the IPED 102, 200, 300 may need a large number of registers, resulting in substantial area consumption. Instead of storing all the data, counting the occurrence of data variation can save hardware area while enabling a jitter histogram analysis.

Figure 9:
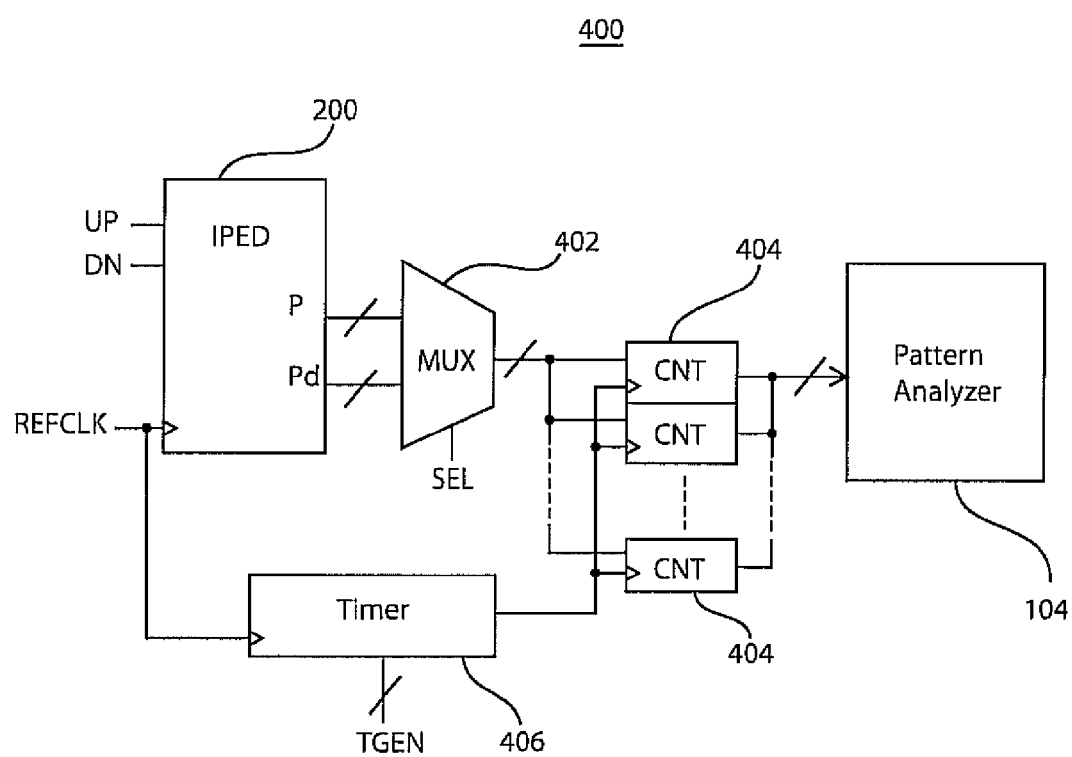
FIG. 9 is a block diagram showing an instantaneous phase error detector (IPED) including a jitter histogram measurement capability.

Referring to FIG. 9, an illustrative system 400 shows an example of achieving a jitter histogram using the IPED 200 (FIG. 6). During certain periods of time in accordance which are set by a timer circuit 406 with a timer period control input (TGEN) and a counter clock input, here provided by the reference clock (REFCLK), counters 404 are activated to count the occurrence of the IPED 200 outputs based on the multi-level threshold detection which is illustrated in FIG. 6. Each counter 404 is associated with a different threshold amount for the instantaneous phase error amplitude. A multiplexer (MUX) 402 selects (in accordance with a select (SEL) signal) either the IPED outputs (P) (based on the method illustrated in FIGS. 4 and 5) or the IPED differential outputs ($P_d$) (based on the scheme illustrated in FIG. 8). By counting each level of the IPED outputs and the IPED differential outputs (for phase angles), jitter histogram information can be obtained. Note that combinations of direct or raw IPED outputs and differential outputs could be provided and processed simultaneously at the cost of a different counter allocation or the allocation of additional counters for these tasks.

Figure 10:
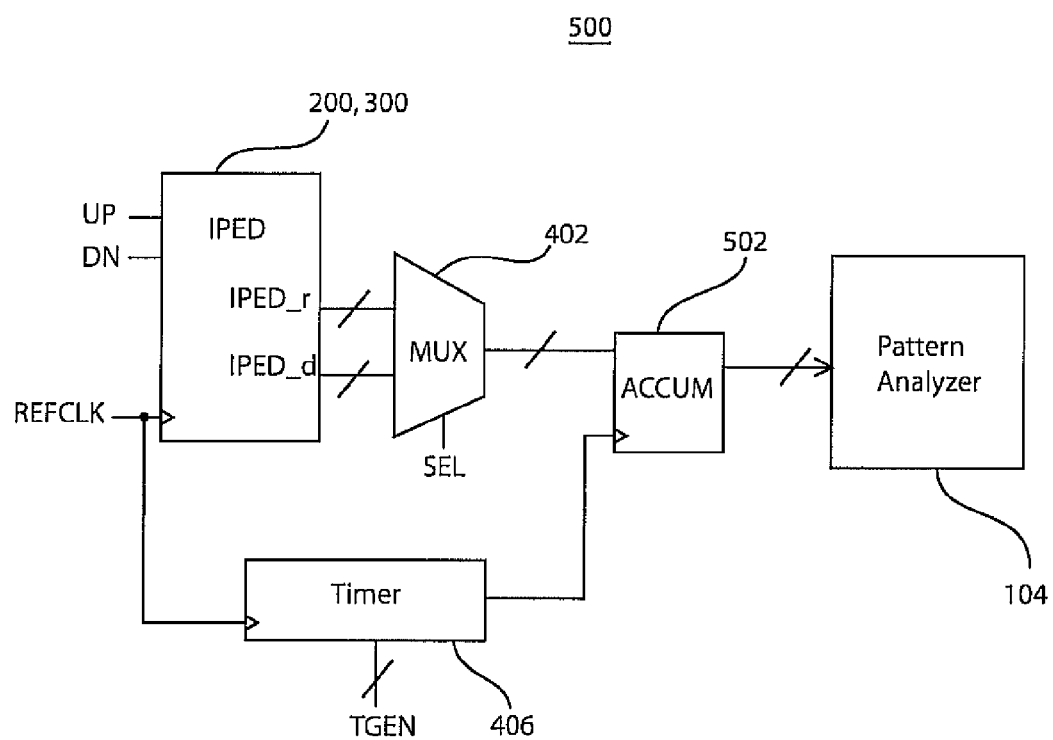
FIG. 10 is a block diagram showing an IPED as a lock detector (LD) and/or a static phase offset monitor.

Since the IPED with multi-level thresholds already includes static phase information, the IPED can be used as a lock detector and/or a static phase offset monitor, as depicted in FIG. 10. Static phase offset is the average time difference between the arrival times of the reference clock and the feedback clock. It is generally a signed quantity. The "static" portion implies a DC phase offset. Informally, static phase offset may in fact vary over time. Static phase offset may be thought of as the average phase offset measured over a relatively long time.

Referring to FIG. 10, a circuit 500 may be employed as a lock detector and static phase offset monitor in accordance with the present principles. By counting and accumulating, with an accumulator 502, the occurrence of the IPED output data over a long period of time, a statistical average of the IPED boundary (e.g., a measure of jitter amplitude), that is, the static phase offset information, may be obtained. Since on-chip delay variation is significant over temperature and process variations, a calibration of the delay circuit is needed to quantify the static phase offset in terms of standard units such as picoseconds.

The IPED outputs may include IPED_r and IPED_d signals. IPED_r and IPED_d are the raw and difference outputs of the IPED, respectively. IPED_r thus corresponds to the raw instantaneous phase error, captured by the output latch once per reference clock cycle. IPED_d thus corresponds to the absolute value of the difference between consecutive measurements of the instantaneous phase error as captured by output latches on consecutive reference clock cycles (e.g., it acts as a transition detector on the raw output).

Figure 11:
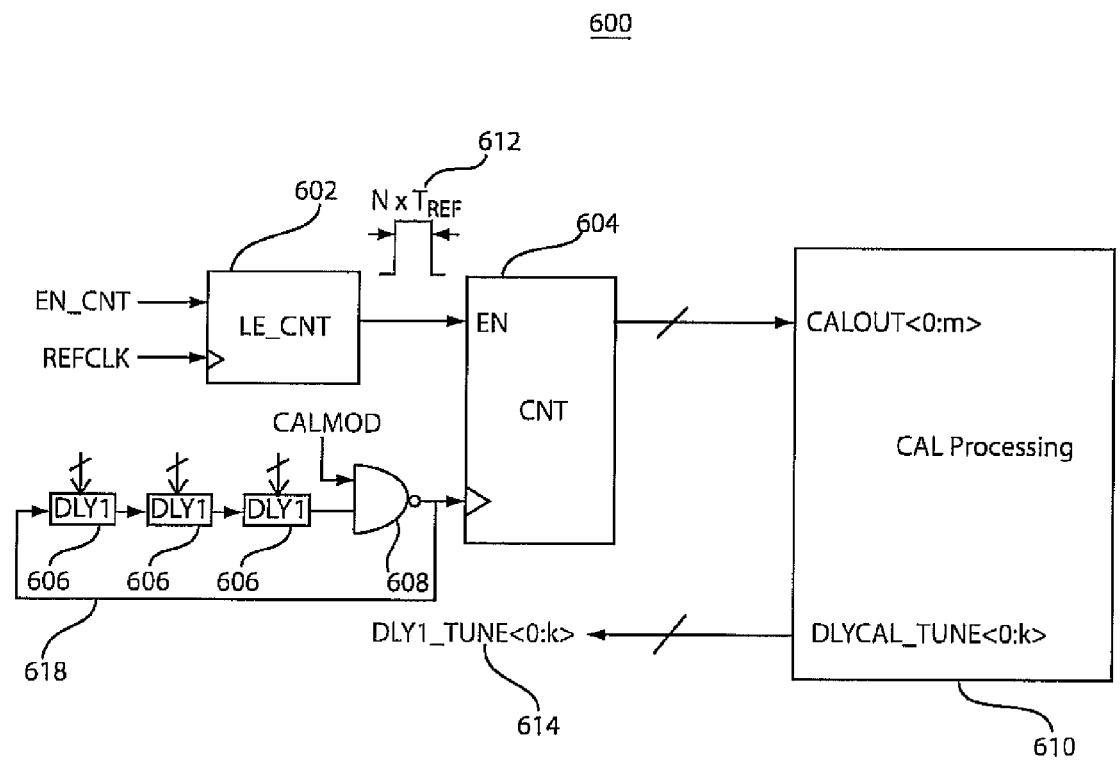
FIG. 11 is a schematic diagram showing a delay calibration scheme in an IPED in accordance with an illustrative embodiment.

Referring to FIG. 11, an illustrative circuit 600 is shown for measuring (hence calibrating) the delay of the delay lines, and, if desired using an additional set of signal inputs, DLY_TUNE<0:k>614, to enable the delay line to be set to a desired frequency. Note that the DLY_TUNE signal could alternately be implemented and controlled as an analog level using an analog calibration loop.

To measure the delay of each delay element, a ring oscillator 618 is formed using the same kind of delay circuit(s) 606 as the delay circuits to be calibrated. The delayed signal is logically combined with a calibration mode signal (CALMOD, e.g., on or off)) using a NAND gate 608 to enable operation of the ring oscillator 608. An enable count signal (EN_CNT) activates a line enable counter (LE_CNT) 602 to count reference clock cycles to determine a time window 612. A counter 604 is enabled in accordance with the time window 612. Using the counter 604, the number of output clocks from ring oscillator 618 within a certain timing window 612 (e.g., $NxT_{REF}$) is counted. The delay time of each delay circuit can be estimated in this way.

A calibration processing system 610 can also adjust the amount of the delay in accordance with process, supply, and temperature variations so that the delay line can provide almost the same value over in the face of such changes. The calibration processing system 610 provides a feedback signal that would enable the absolute delay in the delay elements to be adjusted to more closely match a target absolute delay value.

The calibration processing system 610 receives a calibration output signal (CALOUT) to determine whether a given delay line needs tuning. Specifically, through knowing the operating frequency of the calibration ring oscillator, the delay per stage of the delay element can be computed, neglecting the effect of the AND gate delay associated with the enable path of the oscillator. Note that alternate means of disabling the ring are possible. In this configuration, the delay per stage represents a sensitivity threshold of an IPED. If maintaining a fixed absolute sensitivity threshold is desired, delay control signals, such as delay_tune<0:k> given in FIG. 11, can be adjusted to enable compensation for process, supply, and/or delay element variation.

Compared to calibration methods using a delay-locked loop (DLL), the approach of FIG. 11 is more favorable to digital systems since it does not require an analog delay-locked loop, which, in general, uses a passive loop filter, a phase detector, and a charge pump.

Since a minimum IPED threshold is determined by a minimum propagation delay of the delay line, achieving an IPED with fine resolution using fixed unit gates such as inverters as delay elements depends on the intrinsic speed of the technology employed. Alternately, implementing finer analog or digital controls of the delay elements can enable higher resolution.

Figure 12:
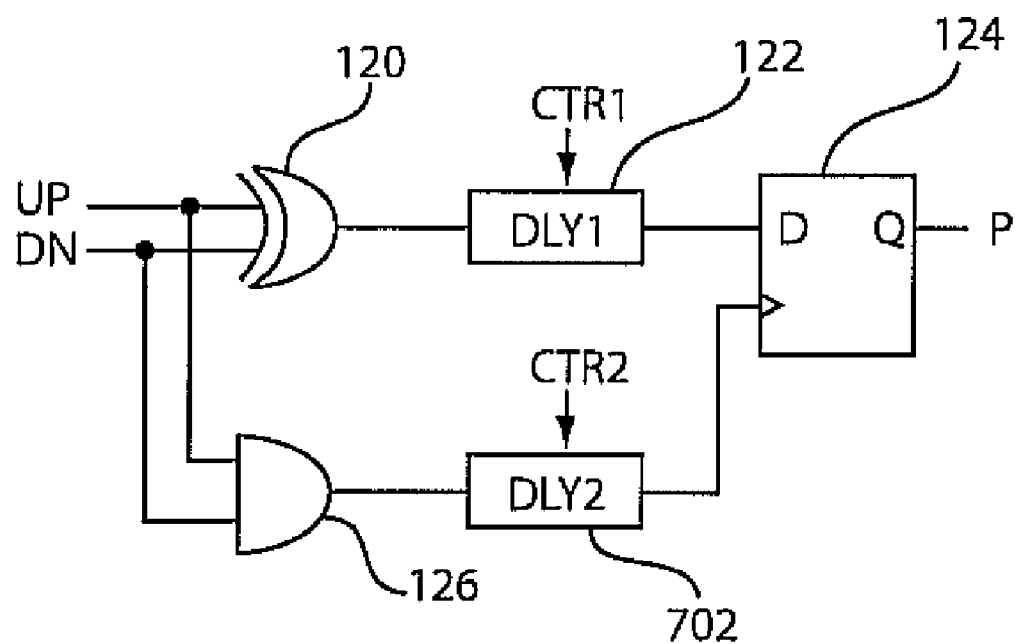
FIG. 12 is a schematic diagram showing an IPED employing a Vernier method to achieve a finer resolution in accordance with an illustrative embodiment.

Referring to FIG. 12, by adding an additional delay line, DLY2 702, the insertion delay associated with the delay line, DLY1 122, which sets a lower bound on the minimum detectable instantaneous phase offset, can be compensated in circuit 700. By controlling the delay amount of the auxiliary delay line, DLY2 702, finer IPED resolution can be achieved, by the immediate action of compensating for the minimum insertion delay associated with DLY1 122, as well as by enabling the application of Vernier techniques to set an effective detection threshold.

Because the reference clock is used to sample the phase offset behavior of the PLL, the primary frequency range to which the monitor systems described thus far apply is from the PLL bandwidth frequency to the reference clock frequency. Below the PLL bandwidth frequency, reference clock noise can dominate PLL noise behavior. Since the reference clock acts as the time base in the described monitor systems, PLL output jitter dominated by input reference clock jitter below the loop bandwidth will not be captured. Variations in instantaneous phase error (related to jitter) beyond the reference clock frequency, meanwhile, may also not be detected because the described monitor system's sample rate is limited to the reference clock frequency.

Figure 13:
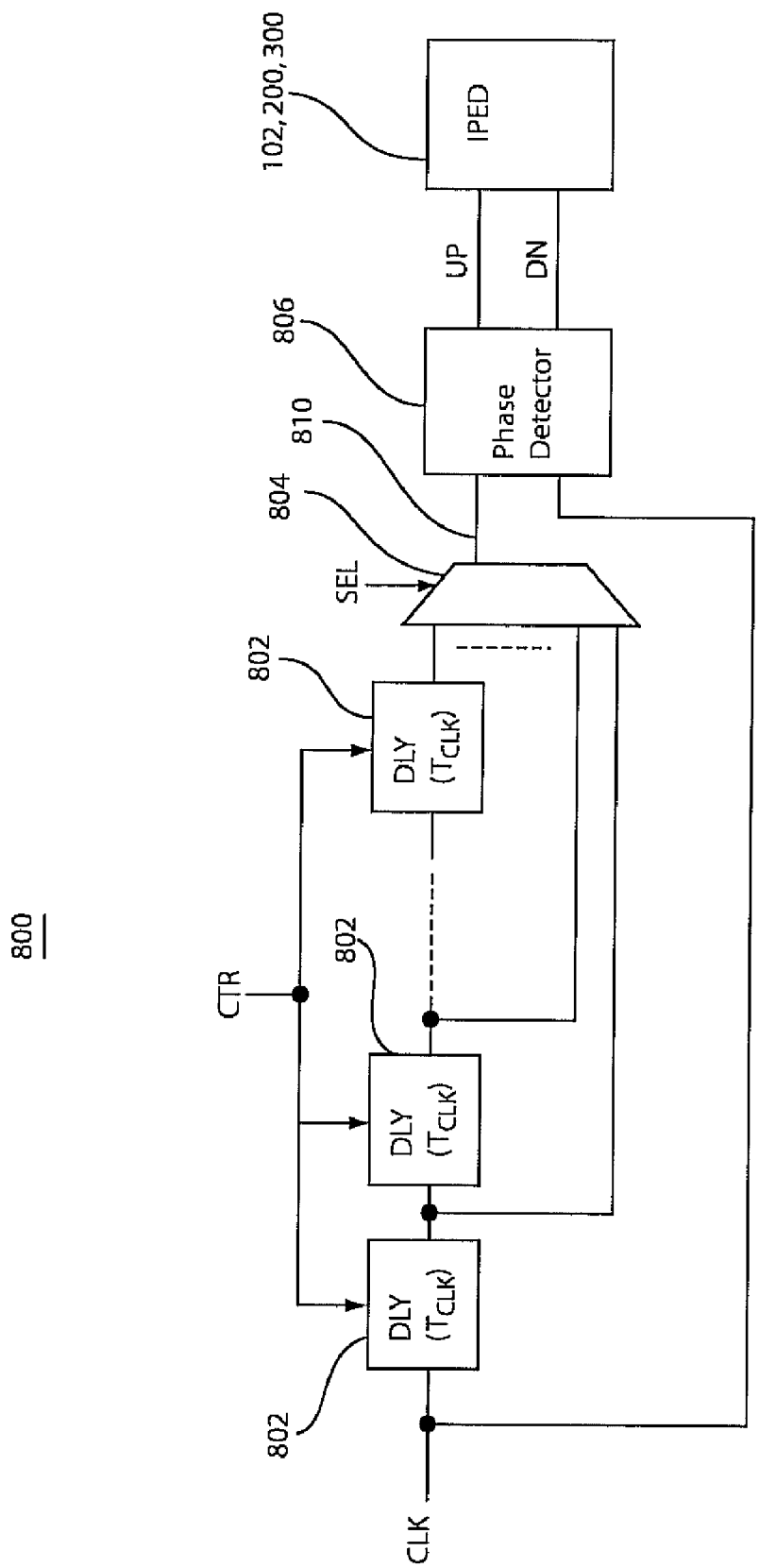
FIG. 13 is a block diagram showing short-term jitter measurement using an IPED in accordance with an illustrative embodiment.

It is therefore the case that the IPED system described thus far mainly enables measurement of medium- to long-term jitter in PLL circuits. FIG. 13 presents an illustrative embodiment showing how the principles set forth herein can be generally extended to short-term jitter measurement.

Referring to FIG. 13, instead of taking IPED outputs as the IPED input, an incoming clock CLK and a delayed incoming clock 810 are used as phase detector 806 inputs. The phase error signals (UP and DN) are then input to IPED 102 (200, 300, etc.). Using a multiplexer 804 and a select signal SEL, a different number of delay stages 802 can be selected, and the behavior of the clock under different offset conditions can be measured. Based on statistical measurement and processing of outputs as generated with different selections of stages 802 in accordance with a CTR signal, cycle-to-cycle jitter can be predicted with post processing (e.g., using pattern analyzers, etc.).

Having described preferred embodiments of a system, apparatus and method for on-chip phase error measurement to determine jitter in phase-locked loops (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. An apparatus, comprising
   a phase-locked loop (PLL) circuit including a phase-frequency detector configured to output phase error signals;
   a phase error monitor circuit configured to determine instantaneous peak phase error by logically combining the phase error signals and comparing pulse widths of the logically combined phase error signals to a programmable delay time at each reference clock cycle to determine instantaneous phase error change;
a storage element configured to store the instantaneous phase error change; and
a plurality of cascaded delay lines configured to determine and store instantaneous phase error information.

2. The apparatus as recited in claim 1, further comprising a pattern analyzer coupled to the storage element to determine patterns in the instantaneous phase error changes to estimate PLL jitter.

3. The apparatus as recited in claim 2, wherein the pattern analyzer is enabled by a lock detector of the PLL.

4. The apparatus as recited in claim 2, wherein the pattern analyzer determines peak phase error thresholds and the peak phase error thresholds are employed to the adjust a delay line which provides the delay time.

5. The apparatus as recited in claim 1, wherein the reference clock includes a logical combination of the phase error signals.

6. The apparatus as recited in claim 1, wherein the phase error signals are logically combined with an exclusive OR gate and the programmable delay time is provided by a delay line.

7. The apparatus as recited in claim 1, wherein a first instantaneous phase error change signal is provided when the pulse widths of the logically combined phase error signals exceed the programmable delay time at each reference clock cycle, otherwise a second instantaneous phase error change signal is provided.

8. An apparatus, comprising
a phase-locked loop (PLL) circuit including a phase-frequency detector configured to output phase error signals;
a phase error monitor circuit configured to determine instantaneous peak phase error, the phase error monitor circuit including:
an exclusive OR gate configured to logically combine the phase error signals to provide a first output signal; and
a programmable delay line configured to provide a delay time to the first output signal as a threshold against which instantaneous phase error change of the output signal is measured at each reference clock cycle;
a storage element configured to store the instantaneous phase error change; and
a plurality of cascaded delay lines configured to determine and store instantaneous phase error change information.

9. The apparatus as recited in claim 8, further comprising a pattern analyzer coupled to the storage element to determine patterns in instantaneous phase error change information.

10. The apparatus as recited in claim 8, wherein the pattern analyzer determines peak phase error thresholds and the peak phase error thresholds are employed to the adjust the delay line which provides the delay time.

11. The apparatus as recited in claim 8, wherein the reference clock includes a logical combination of the phase error signals.

12. The apparatus as recited in claim 8, wherein a first instantaneous phase error change signal is provided when the pulse width of the first output signal exceeds the delay time at each reference clock cycle, otherwise a second instantaneous phase error change signal is provided.

13. An apparatus for short-term jitter measurement, comprising:
a plurality of programmable delay stages configured to permit selection of a different amount of delay for a clock signal to provide a delayed clock signal for adjustable short-term measurement of jitter movement;
a phase detector including as inputs the clock signal and the delayed clock signal, the phase detector including a phase-frequency detector configured to output phase error signals; and
a phase error monitor circuit configured to determine peak instantaneous phase error change by logically combining the phase error signals and comparing pulse widths of the logically combined phase error signals to a programmable delay time at each reference clock cycle to determine the instantaneous phase error change, wherein the phase error signals are logically combined with an exclusive OR gate and the programmable delay time is provided by a delay line.

14. The apparatus as recited in claim 13, wherein a first instantaneous phase error change signal is provided when the pulse widths of the logically combined phase error signals exceed the programmable delay time at each reference clock cycle, otherwise a second instantaneous phase error change signal is provided.

* * * * *